United States Patent [19]

Mattes et al.

[11] Patent Number: 5,796,291

[45] Date of Patent: Aug. 18, 1998

[54] METHOD AND APPARATUS FOR COMPENSATING FOR TEMPERATURE FLUCTUATIONS IN THE INPUT TO A GAIN CIRCUIT

[75] Inventors: Michael F. Mattes, Janesville; James D. Seefeldt, DeForest, both of Wis.

[73] Assignee: SSI Technologies, Inc., Janesville, Wis.

[21] Appl. No.: 619,166

[22] Filed: Mar. 21, 1996

Related U.S. Application Data

[63] Continuation of Ser. No. 291,878, Aug. 17, 1994, abandoned, which is a continuation-in-part of Ser. No. 228,963, Apr. 15, 1994, abandoned.

[51] Int. Cl.$^6$ .................................................. H01L 35/00
[52] U.S. Cl. ........................... 327/513; 327/83; 327/362
[58] Field of Search ........................... 330/289, 282, 330/286; 327/83, 362, 512, 513, 378, 560–563

[56] References Cited

U.S. PATENT DOCUMENTS

| | | | |
|---|---|---|---|
| 3,705,316 | 12/1972 | Burrows et al. | 327/513 |
| 3,740,658 | 6/1973 | Loving, Jr. | 330/256 |
| 4,207,538 | 6/1980 | Goel | 330/289 |
| 4,465,075 | 8/1984 | Swartz | 128/672 |
| 4,478,527 | 10/1984 | Merger | 330/289 |
| 4,582,976 | 4/1986 | Merrick | 219/121 LJ |
| 4,705,964 | 11/1987 | Higgs | 307/278 |
| 4,716,315 | 12/1987 | Bell | 327/513 |
| 4,766,655 | 8/1988 | Hickox | 29/25.35 |
| 4,766,763 | 8/1988 | Kurtz | 73/49.2 |
| 4,774,863 | 10/1988 | Guckel et al. | 156/653 |
| 4,777,826 | 10/1988 | Rud, Jr. et al. | 73/708 |
| 4,792,782 | 12/1988 | Hammond | 338/309 |
| 4,803,457 | 2/1989 | Chapel, Jr. et al. | 338/195 |
| 4,853,669 | 8/1989 | Guckel et al. | 338/4 |
| 4,882,767 | 11/1989 | Machida et al. | 330/289 |
| 4,901,052 | 2/1990 | Chapel, Jr. et al. | 338/308 |
| 4,906,966 | 3/1990 | Imamura et al. | 338/195 |
| 4,907,341 | 3/1990 | Chapel, Jr. et al. | 29/612 |
| 4,939,395 | 7/1990 | Asano et al. | 327/513 |
| 4,996,082 | 2/1991 | Guckel et al. | 427/99 |
| 5,187,985 | 2/1993 | Nelson | 73/708 |
| 5,197,334 | 3/1993 | Guziak | 73/708 |
| 5,206,623 | 4/1993 | Rochette et al. | 338/203 |
| 5,243,319 | 9/1993 | Brokaw | 338/195 |
| 5,363,084 | 11/1994 | Swinehart | 338/308 |

FOREIGN PATENT DOCUMENTS 0 409 213 A2  7/1990  European Pat. Off. .......... G01L 9/06

OTHER PUBLICATIONS

Semens Aktiengesellschaft, Temperature and Pressure Sensor Data Book, (1990–1991); pp. 93–97.
Motorola Pressure Sensor Device Data; Motorola, Inc., 1990.
Eugene Svoboda, "Passive Compensation of a Monolithic Silicon Pressure Transducer", Sensym, Inc., 1986.
P.E.M. Frere, S. J. Prosser, "Temperature Compensation of Silion Pressure Sensors For Automotive Applications", Lucas Research Centre, Lucas Engineering & Systems Ltd., U.K., pp. 270–274.
Yamada, et al., "A Piezoresistive Integrated Pressure Sensor", Sensors and Actuators, 4 (1983); pp. 63–69.
Xian–Ping Wu, et al., "An Integrated Pressure Transducer For Biomedical Applications", Sensors and Actuators, 2 (1982); pp. 309–320.
Willig, "Operational Amplifiers", EXAMplifications, May/Jun. 1993; pp. 256–258.

(List continued on next page.)

Primary Examiner—Toan Tran
Attorney, Agent, or Firm—Michael Best & Friedrich LLP

[57] ABSTRACT

An electronic gain circuit adapted to receive an input signal, an amplifier having a gain for amplifying the input signal to produce an output signal, and biasing resistors connected to the amplifier to automatically adjust the gain of the amplifier in response to fluctuations in ambient temperature such that the output signal of the amplifier responds to ambient temperature fluctuations.

17 Claims, 2 Drawing Sheets

OTHER PUBLICATIONS

Poff, "Stable Miniature Pressure Transducer Using Inorganic Bonding Construction", Endevco Corporation, 1987; pp. 373–382.

Williams, "Good bridge-circuit design satisfies gain and balance criteria", *EDN Designers' Guide to Bridge Circuits*, Oct. 25, 1990; pp. 161–174.

Dresser Industries Brochure –Ashcroft "Model K1 Thin Film Pressure Transmitter".

Sensotec Brochure –"Subminiature Pressure Transducers", pp. 10–11.

Schultz, "Amplifiers for Semiconductor Pressure Sensors", Motorola Semiconductor Products, pp. 291–298.

Russell L. Johnson and David B. Wamstad, "An Advanced Solid State Integrated Pressure Transducer", 1983, pp. 568–573.

METHOD AND APPARATUS FOR COMPENSATING FOR TEMPERATURE FLUCTUATIONS IN THE INPUT TO A GAIN CIRCUIT

RELATED APPLICATIONS

This is a continuation of application Ser. No. 08/291,878, filed Aug. 17, 1994, entitled "Improved Method And Apparatus For Compensating For Temperature Fluctuations In The Input To A Gain Circuit", now abandoned, which is a continuation-in-part patent application of U.S. patent application Ser. No. 08/228,963 titled "METHOD AND APPARATUS FOR COMPENSATING FOR TEMPERATURE FLUCTUATIONS IN THE INPUT TO A GAIN CIRCUIT" filed Apr. 15, 1994, now abandoned.

BACKGROUND OF THE INVENTION

The invention relates to electronic amplifiers or gain circuits, and particularly, to a method and apparatus for compensating for temperature induced changes in the characteristics of an input to the gain circuit.

Gain circuits, i.e., circuits providing any form of current gain, voltage gain, transconductance, or transimpedence, are used in many applications to buffer, amplify or provide signal conditioning to an input signal. Often however, the characteristics of the gain circuit or the input signal itself are sensitive to changes in temperature. In some applications, for example, automotive applications, gain circuits can be used to condition and perhaps amplify the output from a transducer such as a full-bridge piezoresistive pressure transducer. In the automobile, where temperatures can fluctuate from −40° C. to 150° C., the sensitivity of such a pressure transducer can vary widely thereby varying the output of the full-bridge piezoresistive pressure sensor. Moreover, the variation in temperatures can cause the offset and span of the gain circuit to vary.

Traditional methods of accounting for changes in the offset and span of the gain circuit as well as the temperature induced fluctuations of the input to the gain circuit have included, in the case of a transducer, the connection of temperature compensation resistors in parallel and in series with the full-bridge sensing structure. However, the use of such compensation resistors detracts from the output sensitivity of the full-bridge sensing structure and is limited in its application to such a full-bridge sensing structure.

Other attempts to compensate for temperature fluctuations include providing the circuit with a microprocessor, which monitors the temperature and modifies the output signal of the gain circuit accordingly or accounts for the temperature induced variations in the signal with software. However, this requires sophisticated circuitry which increases the cost of the circuit, increases the potential for expensive failures, and increases the amount of space required by the circuit.

Another method of compensating for temperature fluctuations utilizes a temperature sensitive diode to automatically adjust the supply voltage of the circuit in response to temperature changes. However, the temperature characteristics of the diode are dependent upon fundamental, physical constants and cannot be varied with process changes. Therefore, additional complex circuitry is required to use the diode for temperature compensations.

SUMMARY OF THE INVENTION

Therefore, it is desirable to provide a method and apparatus for automatically adjusting the gain of a gain circuit to eliminate temperature induced fluctuations in the output of the gain circuit. Accordingly, the invention provides an electronic gain circuit including an input for receiving an input signal that is functionally related to temperature. The gain circuit also includes an amplifier for amplifying the input signal at a predetermined gain to produce an output signal. The gain of the amplifier is automatically adjusted in response to fluctuations in temperature so that the output signal of the amplifier responds to temperature fluctuations in a predetermined way.

The desired gain of the amplifier may be positive or negative or zero (ignoring adjustments for temperature) and may be calculated as a current gain ($I_{OUT}/I_{IN}$), voltage gain ($V_{OUT}/V_{IN}$), transconductance ($I_{OUT}/V_{IN}$), or transimpedence ($V_{OUT}/I_{IN}$). The gain of the amplifier is adjusted in response to fluctuations in ambient temperatures such that the amplified output signal remains substantially unaltered by temperature induced fluctuations of the input to the gain circuit and of the offset and span characteristics of the amplifier in the gain circuit.

The gain of the amplifier is adjusted automatically by means of thin film, polysilicon resistors, the resistance of which varies in response to temperature fluctuations. The degree to which the resistance of the resistors varies in response to fluctuations in temperature is directly related to the temperature coefficient of the material forming the resistors.

The resistors are connected in the gain circuit to bias the amplifier as feedback and input resistors. Because the gain of the amplifier is dependent upon the resistance values of the feedback and input resistors, the temperature coefficients of the resistors can be precisely selected so that, as temperature fluctuations cause variations in the input signal, span, offset or other characteristics of the amplifier, the resistance of the input and feedback resistors varies in a known way to automatically adjust the gain of the amplifier and compensate for the temperature induced fluctuations in the input signal, span, offset, etc. The automatic gain adjustment produces an output signal independent of temperature fluctuations or in another embodiment, produces an output signal that varies in a known way in response to temperature fluctuations.

The invention also provides a method of providing for a predetermined change in the gain of an amplifier in response to a change in temperature. The method includes the steps of providing an amplifier having an output, and providing at least one biasing resistor for the amplifier. The resistor has a predetermined temperature coefficient precisely chosen such that variations in temperature vary the resistance of the resistor in a predetermined way thereby adjusting the gain of the amplifier in response to a change in temperature.

The method also includes the step of connecting the resistor to the amplifier such that the gain of the amplifier responds to variations of temperature in a predetermined way to generate a gain circuit output which is independent of fluctuations in temperature or which varies in a known way in response to temperature fluctuations. The step of providing the biasing resistor for the amplifier includes the step of precisely selecting the implant or doping levels of the integrated circuit resistors; that is, precisely selecting the material composition of the resistors so that the resistors have a specific temperature coefficient and will respond to temperature fluctuations in a known and predictable way. By providing such precisely chosen characteristics of the resistor, the gain will increase or decrease according to the changes in temperature to provide an output signal that is independent of fluctuations in temperature.

3

A principal advantage of the invention is the provision of a gain circuit having an amplifier, the gain of which is automatically adjusted in response to temperature fluctuations to provide an output signal that is independent of the temperature fluctuations.

It is another advantage of the invention to provide a method of automatically adjusting the gain of an amplifier in response to temperature fluctuations to produce an output signal that is substantially independent of temperature fluctuations.

It is another advantage of the invention to provide a method and apparatus for compensating for temperature fluctuations in a gain circuit, which method and apparatus are simple and inexpensive.

Other features and advantages of the invention will become apparent to those skilled in the art upon review of the following detailed description, claims and drawings.

BRIEF DESCRIPTION OF THE DRAWINGS

The drawings illustrate the best mode presently contemplated for carrying out the invention.

Figure 1:
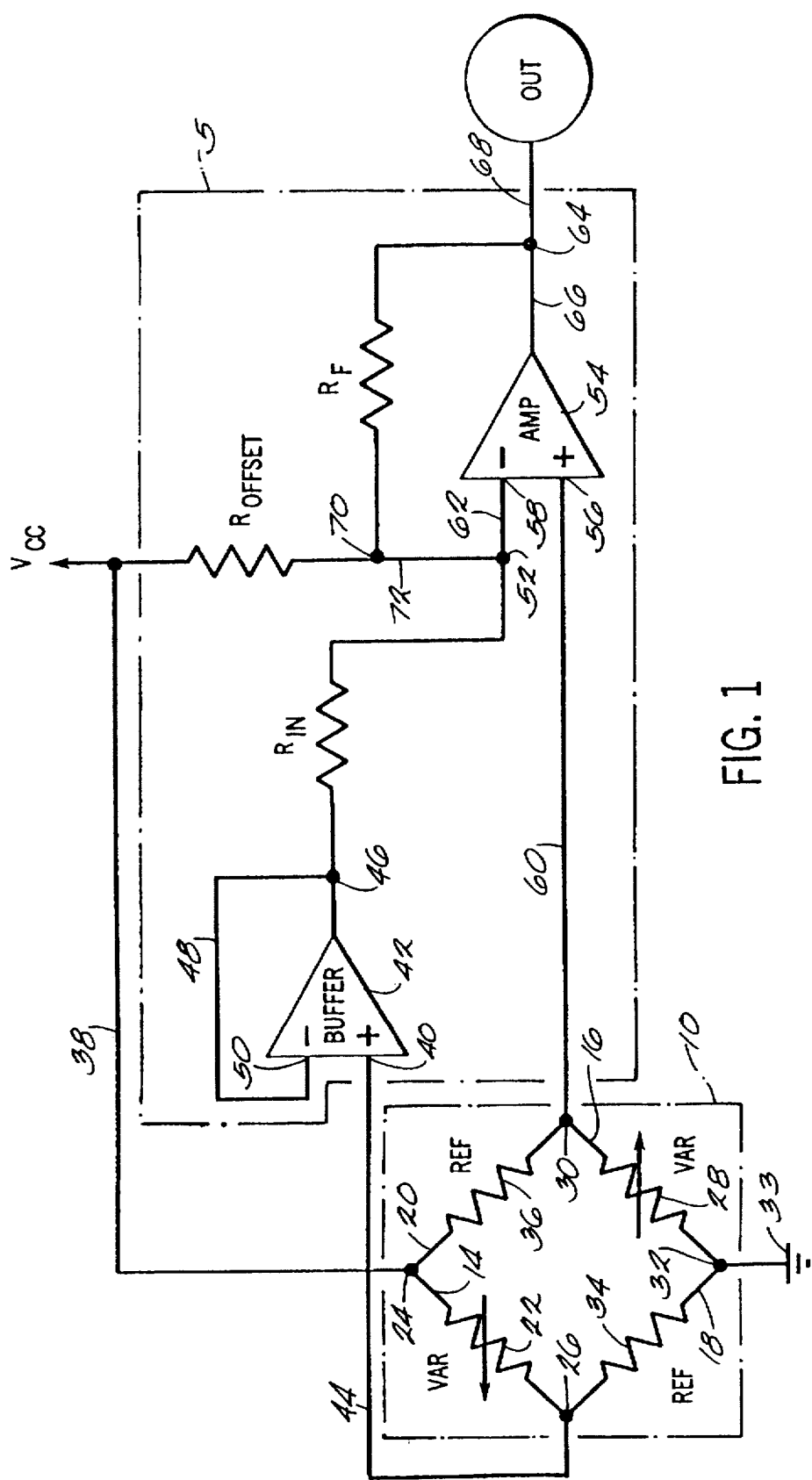
FIG. 1 is an electrical schematic diagram of the circuit of this invention.

Before one embodiment of the invention is explained in detail, it is to be understood that the invention is not limited in its application to the details of construction and the arrangement of components set forth in the following description or illustrated in the drawings. The invention is capable of other embodiments and of being practiced or of being carried out in various ways. Also, it is to be understood that the phraseology and terminology used herein is for the purpose of description and should not be regarded as limiting.

DETAILED DESCRIPTION OF THE PREFERRED EMBODIMENT

Shown in FIG. 1 of the drawings is a gain circuit 5 embodying the invention. The gain circuit may produce any type of gain including current gain ($I_{OUT}/I_{IN}$), voltage gain ($V_{OUT}/V_{IN}$), transconductance ($I_{OUT}/V_{IN}$) or transimpedance ($V_{OUT}/I_{IN}$) and, depending upon the application, the gain may be positive, negative, greater than unity, less than unity, equal to unity, or zero (as measured at room temperature (250° C.)). The specific gain circuit shown in the drawing produces a positive voltage gain ($V_{OUT}/V_{IN}$) greater than unity gain. Moreover, while the gain circuit 5 may be connected to any circuit requiring compensation for temperature induced variations, the gain circuit 5 is shown connected to the output of a full-bridge piezoresistive pressure transducer 10. One such pressure transducer is shown and described in U.S. Pat. Nos. 4,744,863; 4,853,669; and 4,996,082; which are incorporated herein by reference. In the case of a pressure transducer, the gain circuit preferably provides a full-scale output from zero volts to five volts over the pressure range to be measured.

The transducer 10 includes a resistor bridge 12 having four resistor arms 14, 16, 18, and 20. Resistor arm 14 includes a piezoresistive element 22 which interconnects junctions 24 and 26. The resistivity of the piezoresistive element 22 increases linearly with an increase in pressure exerted on the bridge 12.

A second piezoresistive element 28 is included in resistor arm 16. Piezoresistive element 28 interconnects junctions 30 and 32. As with piezoresistive element 22, the resistivity of

4 piezoresistive element 28 increases linearly with an increase in pressure exerted on the bridge 12.

A first constant resistive element 34 interconnects junctions 26 and 32. Junction 32 is connected to a ground connection 33. A second constant resistive element 36 interconnects junctions 24 and 30. Junction 24 is connected to a source voltage $V_{cc}$ by line 38.

Junction 26 is also connected to the positive (non-inverting) terminal 40 of an operational amplifier 42 by line 44. The output of operational amplifier 42 is supplied to junction 46 and the output is substantially equal to the input voltage at terminal 40 of buffer amplifier 42. Line 48 interconnects junction 46 with the negative (inverting) terminal 50 on operational amplifier 42 so that operational amplifier 42 is connected in a voltage follower configuration to act as a buffer amplifier. Buffer amplifier 42 isolates the voltage at line 40 from differential amplifier 54 so as to prevent the loading down of junction 26.

Junction 46 is also interconnected to junction 52 by an input resistor, $R_{in}$. The resistivity of input resistor $R_{in}$ is inversely proportional to temperature. As temperature increases, the resistivity of input resistor $R_{in}$ decreases, or in other words, the resistor $R_{in}$ has a negative temperature coefficient ($\propto_{in}$). Conversely, if temperature decreases, the resistivity of input resistor $R_{in}$ increases. The resistance of $R_{in}$ is defined at any temperature by the equation:

$$R_{in}=R_{in_0}[1+\propto_{in}(T-T_0)]$$

where:

$R_{in_0}$=Resistance of $R_{in}$ at Room Temperature (25° C.)

$\propto_{in}$=Temperature Coefficient of $R_{in}$

T=Operating Temperature $T_0$=Room Temperature (25° C.)

As shown in the drawings, the gain circuit includes an operational amplifier 54 having a positive (non-inverting) input terminal 56 and a negative (inverting) input terminal 58. Positive terminal 56 is connected to junction 30 of bridge 12 by line 60. Negative terminal 58 is connected to junction 52 by line 62. The output of operational amplifier 54 is connected to junction 64 by line 66. Line 68 carries the output signal of the gain circuit 5 from junction 64. As described in greater detail below, operational amplifier 54, hereinafter referred to as a differential amplifier, is connected in the differential mode so as to amplify the difference between the voltage at junction 46 and the voltage at junction 30.

A feedback resistor, $R_f$ interconnects junction 64 and junction 70. The resistivity of feedback resistor $R_f$ is directly proportional to temperature. As temperature increases, the resistivity of feedback resistor $R_f$ increases, or in other words, the resistor $R_f$ has a positive temperature coefficient ($\propto_f$). Conversely, if temperature decreases, the resistivity of feedback resistor $R_f$ decreases. The resistance of $R_f$ is defined at any temperature by the equation:

$$R_f=R_{f_0}[1+\propto_f(T-T_0)]$$

where:

$R_{f_0}$=Resistance of $R_f$ at Room Temperature (25° C.)

$\propto_f$=Temperature Coefficient of $R_f$

T=Operating Temperature $T_0$=Room Temperature (25° C.)

Junction 70 and junction 52 are connected by line 72. Junction 70 is also connected to voltage source $V_{cc}$ through an offset resistor $R_{OFFSET}$. In the embodiment shown in the drawings, offset resistor $R_{OFFSET}$ has a resistivity substantially equal to the resistivity of the feedback resistor $R_f$. Like feedback resistor $R_f$, the resistivity of offset resistor $R_{OFFSET}$ is directly proportional to temperature and the temperature coefficient of $R_{OFFSET}$ is equal to the temperature coefficient of $R_f$. Therefore, as the temperature changes, the resistivity of feedback resistor $R_f$ and the resistivity of offset resistor $R_{OFFSET}$ remain substantially equal.

Differential amplifier 54 is designed to produce an amplified signal corresponding to the difference between the voltages at junction 26 and junction 30 of bridge 12. The following equation represents the output voltage of differential amplifier 54 at node 64:

$$\text{Output} = \left[1 + \frac{R_f}{R_{parallel}}\right] \times V_{pbridge} - \left[\frac{R_f}{R_{in}}\right] \times V_{nbridge} - \left[\frac{R_f}{R_{offset}}\right] \times V_{cc}$$

where:

$R_{OFFSET}$=Resistance of $R_{OFFSET}$
$R_{IN}$=Resistance of $R_{IN}$
$R_f$=Resistance of $R_{FEEDBACK}$ $$R_{parallel} = \frac{(R_{in}) \times R_{OFFSET}}{(R_{in}) + R_{OFFSET}}$$

$V_{pbridge}$=Voltage at junction 30 of bridge 12
$V_{nbridge}$=Voltage at junction 46
$V_{cc}$=Source voltage At zero pressure (relative to a standard such as atmospheric pressure) and at a selected temperature (preferably room temperature, which is 25° C.), the resistivity of the feedback resistor $R_f$ is equal to the resistivity of input resistor $R_{in}$ multiplied by the desired gain. The resistivity of feedback resistor $R_f$ is substantially equal to the resistivity of offset resistor $R_{OFFSET}$. By substitution in the above described equation, it is determined that at zero pressure and at the selected temperature, the circuit is designed to produce a signal of zero volts at junction 64.

The gain of differential amplifier 54 is defined by the equation:

$$\text{Gain} = \frac{R_f}{R_{in}}$$

Substituting the aforementioned equations for $R_f$ and $R_{in}$:

$$\text{Gain} = \frac{R_f}{R_{in}} = \frac{R_{f_0}}{R_{in_0}} \cdot \frac{[1 + \alpha_f(T - T_0)]}{[1 + \alpha_{in}(T - T_0)]}$$

Therefore, the gain of the circuit is dependent upon temperature and the temperature coefficients $\alpha_f$ and $\alpha_{in}$, of the resistors $R_f$ and $R_{in}$, respectively. The temperature coefficients $\alpha_f$ and $\alpha_{in}$ are usually measured in (parts per million/ °C.) and their values are a function of the particular material used to form $R_f$ and $R_{in}$. By knowing (1) how the input to the differential amplifier 54 (or other characteristics of the gain circuit) will vary with temperature, (2) the mathematical formula for Gain, and (3) the temperature coefficients of selected resistor materials, the materials comprising resistors $R_f$ and $R_{in}$ may be precisely selected to vary the Gain (in any gain circuit) in response to variations in temperature thereby producing an output that is substantially independent of temperature fluctuations or, in another embodiment produce an output that varies in a known way in response to temperature.

In operation, and still using the example of a piezoresistive pressure transducer 10 connected to the gain circuit 5, the bridge 12 is positioned in the pressurized environment in which it is desired to measure pressure. At zero relative pressure, piezoresistive elements 22 and 28 have the same resistivity as the constant resistive elements 34 and 36. As a result of the voltage dividing action of bridge 12, the voltage at junction 26 will be equal to one-half the source voltage, $V_{cc}$. Likewise, since piezoresistive element 28 and constant resistive element 36 have the same resistivity at zero pressure, the voltage at junction 30 is equal to one-half the source voltage, $V_{cc}$.

An increase in pressure will increase the resistivity of piezoresistive elements 22 and 28. When the resistivity of piezoresistive element 28 is increased, the voltage at junction 30 is also increased. On the other hand, as the resistivity of piezoresistive element 22 is increased, the voltage at junction 26 will decrease. This, in turn, lowers the voltage at junction 46. It can be seen from the above described equation that by increasing the voltage at junction 30 and by decreasing the voltage at junction 46, the output voltage of differential amplifier 54 at junction 64 will linearly increase.

As explained above, by knowing precisely how the input, span, offset or other characteristics of a gain circuit will respond to variations in temperature, it is possible to precisely calculate how the gain of the gain circuit must change in order to compensate for the temperature variations in the gain circuit.

Using the example of the pressure transducer, experience with the pressure transducer shows that as temperature increases, the sensitivity to pressure of piezoresistive elements 22 and 28 decreases in a known and predictable way. Therefore, the output of the pressure transducer varies with temperature in a known and predictable way.

Figure 2:
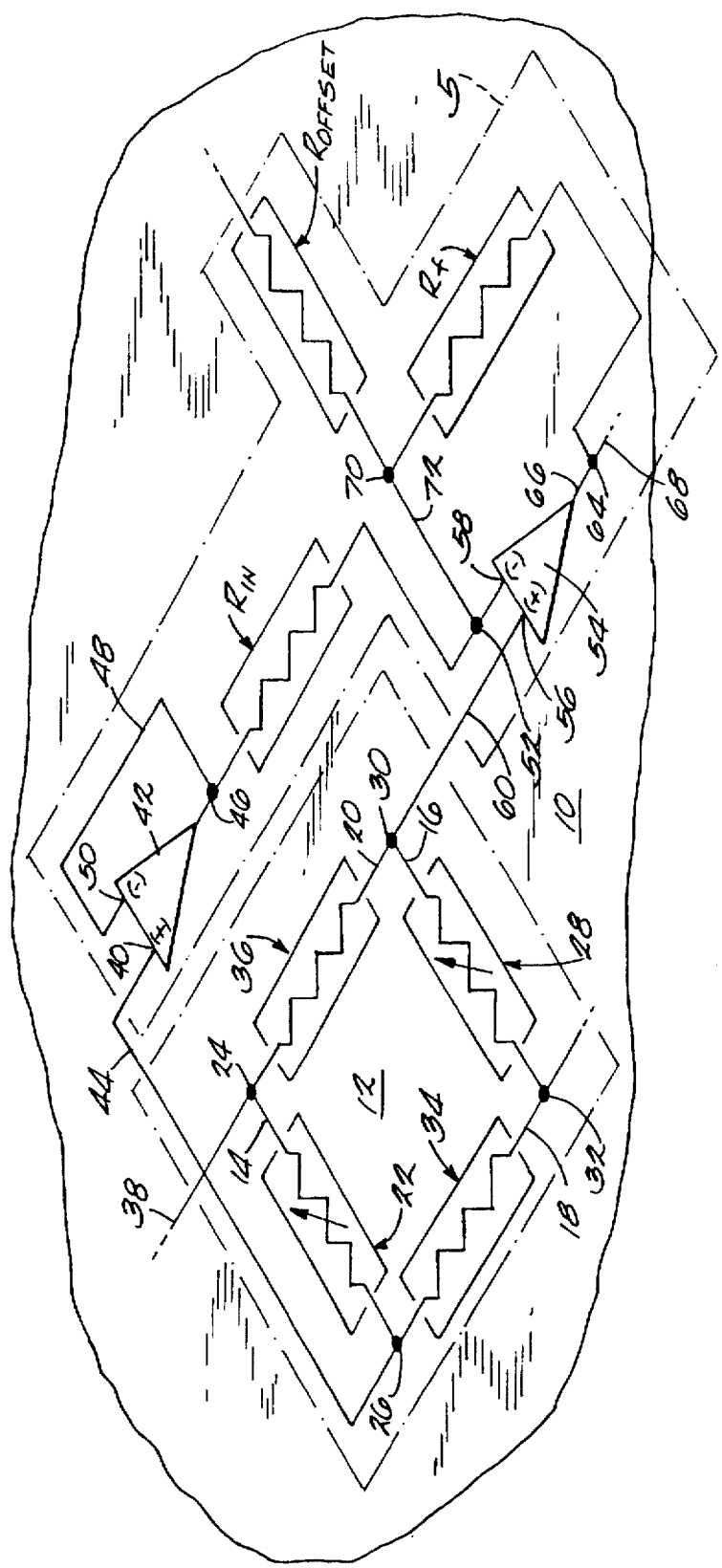
FIG. 2 is a partial isometric view of the circuit of FIG. 1.

In order to compensate for the decrease in sensitivity of the bridge 12, input resistor $R_{in}$, offset resistor $R_{OFFSET}$, and feedback resistor $R_{FEEDBACK}$ are formed in a single integrated circuit chip with the sensing bridge 12. As shown in FIG. 2, the resistors $R_{in}$, $R_{OFFSET}$ and $R_f$ are formed of thin film polysilicon on the same substrate as the sensing structure 12. While formation of these resistors on the same substrate is not an absolute necessity, it is desirable because this will insure that the gain circuit (which provides the temperature compensation) is subject to the same temperature variations as the circuit for which the gain circuit is performing the temperature compensation.

The resistors have been implanted on the substrate of the sensing structure 12 so that the resistivity of input resistor $R_{in}$ will decrease, and the resistivity of feedback resistor $R_f$ and offset resistor $R_{OFFSET}$ will increase when the sensing bridge 12 is subjected to an increase in temperature.

Referring back to the above described equation, an increase in the resistivity of feedback resistor $R_f$ and offset resistor $R_{OFFSET}$ coupled with a decrease in resistivity of input resistor $R_{in}$ will result in an increase in the gain of differential amplifier 54. The result is an increase in the output voltage of differential amplifier 54 at junction 64.

A decrease in temperature will result in input resistor $R_{in}$ increasing in resistivity and feedback resistor $R_f$ and offset resistor $R_{OFFSET}$ decreasing in resistivity. This in turn decreases the gain of differential amplifier 54 according to the above described equation.

By choosing the implant levels of input resistor $R_{in}$, feedback resistor $R_f$ and offset resistor $R_{OFFSET}$ properly, the gain is designed to increase or decrease with ambient temperature fluctuations and in accordance with the change in sensitivity of the sensing bridge 12 over the temperature range thereby compensating for the temperature induced changes in the pressure transducer 10. While it is anticipated that it would be desirable to change the gain linearly in response to temperature fluctuations, it is also possible to select the resistors $R_f$ and $R_{in}$ so that the gain varies non-linearly with respect to changes in temperature thereby producing an amplifier output that varies with temperature in a predetermined way. Such a design could be utilized to accommodate the signal conditioning circuitry (not shown) to which the OUTPUT of the gain circuit 5 is connected. While other dopants such as boron, arsenic and antimony may be appropriate, in the embodiment shown in the drawings, $R_f$ and $R_{OFFSET}$ have impedance values of approximately twenty (20) ohms/square at 25° C. and are doped with $1.8 \times 10^{16}$ cm$^{-2}$ phosphorous at 80 keV and $R_{in}$ has an impedance value of approximately 125 ohms/square and is doped with $2.0 \times 10^{15}$ cm$^{-2}$ phosphorous at 80 keV. Thus, the implant levels of each resistor are chosen such that the voltage at junction 64 will remain constant over a given temperature range as long as the pressure on the sensing bridge 12 is constant. The number of squares required will depend upon the sensitivity of the sensor bridge and the sensitivity is dependent upon the physical geometries and mechanical characteristics of the microstructures disclosed in U.S. Pat. Nos. 4,744,863; 4,853,669; and 4,996,082. In any event, the output of the gain circuit 5 on line 68 is independent of temperature.

Other features and advantages of the invention are set forth in the following claims.

We claim:

1. An electronic gain circuit comprising:
    an amplifier having an input for receiving an input signal, having a gain independent of the input signal, having an output, such that the amplifier produces an output signal at the output, and having a closed loop feedback path between the input and the output; and
    means for automatically adjusting the gain of the amplifier in response to ambient temperature fluctuations such that the gain of the amplifier responds to temperature fluctuations to produce the output signal so that the output signal responds in a predetermined way to temperature induced fluctuations of the input signal, the means for automatically adjusting the gain of the amplifier including first and second resistors operatively connected to the amplifier such that the gain is dependent upon the resistivity of the resistors, and wherein each of the resistors have a resistivity functionally related to the ambient temperature.

2. The electronic gain circuit of claim 1 wherein the output signal of the amplifier remains substantially unaltered by ambient temperature fluctuations.

3. The electronic gain circuit of claim 1 and further including a buffer amplifier operatively connected to the amplifier input to buffer the input signal.

4. The electronic gain circuit of claim 3 wherein the buffer amplifier is an operational amplifier connected in a voltage follower mode.

5. The electronic gain circuit of claim 1 wherein the means for automatically adjusting the gain of the amplifier further includes a third resistor operatively connected to the amplifier to determine the gain of the amplifier, and wherein the third resistor has a resistivity functionally related to the ambient temperature.

6. The electronic gain circuit of claim 1 wherein the resistivity of the first resistor increases in response to an increase in ambient temperature to which the gain circuit is subject.

7. The electronic gain circuit of claim 5 wherein the resistivity of the second resistor increases in response to an increase in ambient temperature to which the gain circuit is subject and wherein the resistivity of the third resistor decreases in response to an increase in ambient temperature to which the gain circuit is subject.

8. The electronic gain circuit of claim 1 wherein the resistivity of the first resistor is equal to the resistivity of the second resistor.

9. An electronic gain circuit comprising:
    an amplifier having an input for receiving an input signal, having a gain independent of the input signal, having an output, such that the amplifier produces an output signal at the output, and having a closed loop feedback path between the input and the output;
    a first doped polysilicon biasing resistor having a predetermined temperature coefficient such that the resistivity of the resistor responds to temperature in a predetermined way, the first biasing resistor being connected to the amplifier such that the gain of the amplifier is dependent upon the resistivity of the first biasing resistor and such that the first biasing resistor automatically adjusts the gain of the amplifier in response to ambient temperature fluctuations so that the output signal of the amplifier responds in a predetermined way to temperature induced fluctuations of the input signal, and
    second and third biasing resistors operatively connected to the amplifier to determine the gain of the amplifier with said first biasing resistor, the second and third biasing resistors having resistivities functionally related to the ambient temperature.

10. The electronic gain circuit of claim 9 wherein the output signal of the amplifier remains substantially unaltered by ambient temperature fluctuations.

11. The electronic gain circuit of claim 9 and further including a buffer amplifier operatively connected to the amplifier input to buffer the input signal.

12. The electronic gain circuit of claim 11 wherein the buffer amplifier is an operational amplifier connected in a voltage follower mode.

13. The electronic gain circuit of claim 9 wherein the resistivity of the first biasing resistor increases in response to an increase in ambient temperature to which the gain circuit is subject.

14. The electronic gain circuit of claim 9 wherein the resistivity of the second biasing resistor increases in response to an increase in ambient temperature to which the gain circuit is subject and wherein the resistivity of the third biasing resistor decreases in response to an increase in temperature to which the gain circuit is subject.

15. The electronic gain circuit of claim 9 wherein the resistivity of the first biasing resistor is equal to the resistivity of the second biasing resistor.

16. An electronic gain circuit comprising:
    an amplifier having an input for receiving an input signal and a gain, and the amplifier producing an output signal;
    a first biasing resistor connected to the amplifier and having a predetermined temperature coefficient so that the resistance of the first biasing resistor increases in response to an increase in ambient temperature;
    a second biasing resistor connected to the amplifier and having a predetermined temperature coefficient so that the resistivity of the second biasing resistor increases in response to an increase in ambient temperature; and
    a third biasing resistor connected to the amplifier and having a predetermined temperature coefficient so that the resistivity of the third biasing resistor decreases in response to an increase in ambient temperature. the first. second and third biasing resistors being connected to the amplifier such that the gain of the amplifier is dependent upon the resistivity of the biasing resistors and such that the first and third biasing resistors automatically adjust the gain of the amplifier in response to ambient temperature fluctuations so that the output signal of the amplifier responds to ambient temperature fluctuations.

17. A method of providing for a predetermined response in the gain of an amplifier in response to a fluctuation in ambient temperature, the method comprising:

providing an amplifier having a predetermined gain at a predetermined temperature, the amplifier being adapted to be connected to an input such that the gain is independent of the input and generating an output;

characterizing the response of the input to ambient temperature fluctuations and of said amplifier to ambient temperature fluctuations;

providing a first resistor for the amplifier such that the gain of the amplifier is dependent upon the resistivity of the first resistor and the first resistor has a predetermined temperature coefficient such that fluctuations in ambient temperature vary the resistance of the first resistor;

connecting the first resistor to the amplifier such that the gain of the amplifier responds to fluctuations in ambient temperature to produce said output, such that said output responds to ambient temperature fluctuations; and providing second and third temperature sensitive resistors operatively connected to the amplifier such that the resistivities of the second and third resistors vary in response to ambient temperature fluctuations, and wherein the resistivities of the first and second resistors increase in response to an increase in ambient temperature; and the resistivity of the third resistor decreases in response to an increase in ambient temperature.

* * * * *

UNITED STATES PATENT AND TRADEMARK OFFICE
CERTIFICATE OF CORRECTION

PATENT NO.   : 5,796,291
DATED        : August 18, 1998
INVENTOR(S)  : Mattes et al.

It is certified that error appears in the above-identified patent and that said Letters Patent is hereby corrected as shown below:

Column 3, line 47, "(250°C)" should be --(25°C)--.

Signed and Sealed this

Sixteenth Day of February, 1999

Attest:

Attesting Officer

Acting Commissioner of Patents and Trademarks